United States Patent [19]
Belcher et al.

[11] Patent Number: 5,626,773
[45] Date of Patent: May 6, 1997

[54] STRUCTURE AND METHOD INCLUDING DRY ETCHING TECHNIQUES FOR FORMING AN ARRAY OF THERMAL SENSITIVE ELEMENTS

[75] Inventors: James F. Belcher, Plano; Howard R. Beratan, Richardson; Scott R. Summerfelt, Dallas, all of Tex.

[73] Assignee: Texas Instruments Incorporated, Dallas, Tex.

[21] Appl. No.: 367,659

[22] Filed: Jan. 3, 1995

[51] Int. Cl.⁶ .......................... B44C 1/22; C03C 15/00; C03C 25/06; C23F 1/00
[52] U.S. Cl. .................. 216/47; 216/57; 216/94; 216/13
[58] Field of Search ............... 156/635.1, 656.1, 156/643.1; 216/47, 57, 94

[56] References Cited

U.S. PATENT DOCUMENTS

| | | | |
|---|---|---|---|
| 3,846,820 | 11/1974 | Lampe et al. | 357/31 |
| 4,018,608 | 4/1977 | Frazier | 96/27 |
| 4,080,532 | 3/1978 | Hopper | 250/332 |
| 4,142,207 | 2/1979 | McCormack et al. | 358/113 |
| 4,143,269 | 3/1979 | McCormack et al. | 250/352 |
| 4,162,402 | 7/1979 | Hopper | 250/332 |
| 4,275,302 | 6/1981 | Imbert et al. | 250/330 |
| 4,379,232 | 4/1983 | Hopper | 250/332 |
| 4,594,507 | 6/1986 | Elliott et al. | 250/331 |
| 4,663,529 | 5/1987 | Jenner et al. | 250/338 |
| 4,705,361 | 11/1987 | Frazier et al. | 350/355 |
| 4,750,979 | 6/1988 | Gee et al. | 204/192.3 |
| 4,751,387 | 6/1988 | Robillard | 250/331 |
| 4,949,783 | 8/1990 | Lakios et al. | 165/80.1 |
| 4,980,338 | 12/1990 | Yamazaki | 505/505 |
| 4,994,672 | 2/1991 | Cross et al. | 250/330 |
| 5,010,251 | 4/1991 | Grinberg et al. | 250/332 |
| 5,021,663 | 6/1991 | Hornbeck | 250/349 |
| 5,047,644 | 9/1991 | Meissner et al. | 250/332 |
| 5,051,591 | 9/1991 | Trotta et al. | 250/351 |
| 5,196,703 | 3/1993 | Keenan | 250/332 |
| 5,201,989 | 4/1993 | Douglas et al. | 156/635 |
| 5,238,530 | 8/1993 | Douglas et al. | 156/635 |
| 5,238,592 | 8/1993 | Douglas | 156/635 |
| 5,242,537 | 9/1993 | Nelson | 156/643 |
| 5,264,326 | 11/1993 | Miessner et al. | 430/313 |
| 5,367,167 | 11/1994 | Keenan | 250/338.4 |

FOREIGN PATENT DOCUMENTS

| | | | |
|---|---|---|---|
| 2111746 | of 1971 | Germany | G02B 27/38 |
| 2752704 | of 1978 | Germany | H04N 5/33 |
| 2251952 | 7/1992 | United Kingdom | G02F 1/015 |
| WO9116607 | 10/1991 | WIPO | G01J 5/20 |

OTHER PUBLICATIONS

Rousseau, Francois, et al., *New Approaches for Dry Etching Metal Oxides at Low Temperature and High Rates*, paper submitted at the Chemistry Department University of New Mexico, Albuquerque, NM 87131, pp. 1–6.

(List continued on next page.)

*Primary Examiner*—Richard L. Schilling
*Attorney, Agent, or Firm*—Brian A. Carlson; James C. Kesterson; Richard L. Donaldson

[57] ABSTRACT

An array of thermal sensor elements (16) is formed from a pyroelectric substrate (46) having an infrared absorber and common electrode assembly (18) attached thereto. A first layer of metal contacts (60) is formed to define masked (61) and unmasked (68) regions of the substrate (46). A second layer of metal contacts (62) is formed on the first layer of contacts (60). A radiation etch mask layer (66) is formed to encapsulate the exposed portions of the second layer of contacts (62). A dry-etch mask layer (74) is formed to encapsulate the exposed portions of the first layer of contacts (60) and radiation etch mask layer (66). An initial portion of each unmasked region (68) is etched using a dry-etch process. The remaining portions of the unmasked regions (68) are exposed to an etchant (70) and irradiated with electromagnetic energy to substantially increase the reactivity between the remaining portions and the etchant (70). During such irradiation, the etchant (70) etches the remaining portions substantially faster than the first layer of contacts (60) and the radiation etch mask layer (66).

20 Claims, 3 Drawing Sheets

OTHER PUBLICATIONS

Rousseau, Francois, et al. *Low–Temperature Dry Etching of Metal Oxides and ZnS Via Formation of Volatile Metal B–diketonate Complexes*, Materials Chemistry Communications, paper submitted to J. Mater, May 29, 1992, pp. 1–6.

PlasmaQuest, *Electron Cyclotron Resonance: At the Cusp of a Technology Shift*, paper prepared by PlasmaQuest, Inc. 850 N. Dorothy, Suite 504, Richardson, Texas 75081, vol. 6, No. 1.

R. A. Wood, "HIDAD–A Monolithic, Silicon, Uncooled Infrared Imaging Focal Plane Array," *HIDAD*, date unknown, pp. 579–581.

H. R. Kaufman, et al., "Characteristics, Capabilities and Applications of Broad–Beam Sources," Commonwealth Scientific Corporation (38 pages).

R. N. Castellano, et al., "A Survey of Ion Beam Milling Techniques for Piezoelectric Device Fabrication," pp. 128–134.

Yamamichi, et al., "SrTiO$_3$ Thin Film Preparation by Ion Beam Sputtering and Its Dielectric Properties," Fundamental Research Laboratories, NEC Corporation, 1991, pp. 2193–2196.

R. Watton, et al., "Technologies and Performance for Linear and Two Dimensional Pyroelectric Arrays," *SPIE vol. 510 Infrared Technology X*, 1984, 139–148.

M. Cantagrel, et al. "Argon Ion Etching in a Reactive Gas," *Journal of Materials science 8*, 1973, pp. 1711–1716.

D. J. Warner, et al., "The Preparation and Performance of Reticulated Targets for the Pyroelectric Vidicon," *Ferroelectrics*, 1981, vol. 33, pp. 249–253.

S. Wolf, et al., "Silicon Processing for the VLSI Era," vol. I, Process Technology (4 pages).

U.S. Patent Application USSN 08/222,146 entitled *Multiple Level Mask for Patterning of Ceramic Materials*, filed Apr. 4, 1994, assigned to Texas Instruments Inc. (Attorney's Docket TI–19182).

STRUCTURE AND METHOD INCLUDING DRY ETCHING TECHNIQUES FOR FORMING AN ARRAY OF THERMAL SENSITIVE ELEMENTS

RELATED APPLICATION

This application is related to copending U.S. application Ser. No. 08/367,641, filed Jan. 3, 1995 by James F. Belcher et al. entitled *Method for Etching Through a Substrate to an Attached Coating*; copending, U.S. application Ser. No. 08/368,068, filed Jan. 3, 1995 by James F. Belcher et al. entitled *Method and Structure for Forming an Array of Thermal Sensors*; copending U.S. application Ser. No. 08/093,111 filed Jul. 16, 1993 and entitled *Etching of Transition Metal Oxides*; copending U.S. application Ser. No. 08/235,835, filed Apr. 29, 1994 and entitled *Inter-Pixel Thermal Isolation for Hybrid Thermal Detectors*; and copending U.S. application Ser. No. 08/235,088 filed Apr. 29, 1994, entitled *Thermal Isolation Structure for Hybrid Thermal Detectors*.

TECHNICAL FIELD OF THE INVENTION

The invention relates generally to semiconductor fabrication processes and more specifically to a method and structure for forming an array of thermal sensitive elements including dry etching techniques.

BACKGROUND OF THE INVENTION

One common application for thermal sensors is in thermal (infrared) detection devices such as night vision equipment. One such class of thermal detection devices includes a focal plane array of infrared detector elements or thermal sensors coupled to an integrated circuit substrate with a corresponding number of contact pads disposed between the focal plane array and the integrated circuit substrate. The thermal sensors typically define the respective picture elements or pixels of the resulting thermal image.

One type of thermal sensor includes a thermal sensitive element formed from thermal sensitive material that exhibits a state of electrical polarization and capacitance dependant upon temperature changes in response to thermal radiation. Barium striatum titanate (BST) is one example of such pyroelectric material. For some applications, an infrared absorber and common electrode assembly may be disposed on one side of the thermal sensitive elements. A sensor signal electrode may be disposed on the opposite side of each thermal sensitive element. The infrared absorber and common electrode assembly typically extends across the surface of the focal plane array and may be coupled to each of the thermal sensitive elements. Each thermal sensitive element may have its own separate signal sensor electrode. Each infrared detector element or thermal sensor is defined (in part) by the infrared absorber and common electrode assembly and a respective sensor signal electrode. The thermal sensitive elements may function as a dielectric disposed between the common electrode assembly and the respective sensor signal electrodes which function as capacitive plates.

Various techniques associated with fabrication of very large scale integrated circuits have been used to fabricate a focal plane array and its associated integrated circuit substrate. Examples of such techniques include wet etching and dry etching. Such dry etching techniques typically include ion milling, plasma etching, reactive ion etching, and reactive ion beam etching. Also, laser etching or milling techniques have been used for some applications. Both isotropic and anisotropic etching techniques may be used depending upon the desired configuration for the resulting focal plane array and/or its associated integrated circuit substrate.

Problems associated with both wet and dry etching techniques include undesired etching of the mask layer and/or undesired etching of the substrate and/or other layers deposited during a previous fabrication step. Also, techniques for determining the desired end point of an etching process are critical to prevent over etching and to increase both throughput and reproducibility of the fabrication process. Previously available etching techniques have not provided the desired selectivity to effectively fabricate a focal plane array with the desired throughput and reproducibility between product runs. Also, laser milling frequently produces slag which further limits the use of this technique.

Laser milling often requires thermal annealing and other complex processing due to the interaction between the laser and the material used to form the substrate. Also, laser milling frequently produces slag which further limits the use of this technique. Presently available dry etching techniques require expensive, complex equipment and processes which are not compatible with low cost, high volume production of thermal sensors. Presently available dry etching techniques also require a relatively large or thick etch stop to prevent undesired removal of material.

SUMMARY OF THE INVENTION

In accordance with the present invention, the disadvantages and problems associated with previous techniques such as plasma etching, ion milling, and laser milling used to fabricate thermal sensors from a substrate having multiple layers of different materials disposed thereon have been substantially reduced or eliminated. The present invention allows fabricating a thermal sensor from a substrate of selected pyroelectric and/or bolometric material using an ultraviolet electromagnetic radiation activated etching process with enhanced masking to protect selected regions of the substrate. The resulting thermal sensors cooperate with each other to form a focal plane array which may be coupled with a thermal isolation structure disposed on an integrated circuit substrate as part of a thermal imaging system. One aspect of the present invention may include forming multiple thermal sensitive elements from a substrate of pyroelectric material having a portion of an infrared absorber and common electrode assembly attached to one side of each thermal sensitive element and an electrically conductive contact disposed on the opposite side of each thermal sensitive element.

Another aspect of the present invention may include a method for etching through unmasked regions of a substrate formed from a first material to an attached coating formed from a second material. Multiple contacts or pads may be provided to further shield selected masked regions of the substrate during irradiation of unmasked regions on the substrate. The unmasked regions may then be exposed to an etchant and irradiated to substantially increase reactivity with the etchant such that the etchant etches the unmasked regions substantially faster than it etches the contacts.

Technical advantages provided by one aspect of the present invention include an anisotropic etching process that substantially reduces or eliminates undercutting of mask layers associated with respective masked regions of a substrate and substantially increases the etch rate as compared to other fabrication techniques.

Further technical advantages provided by yet another aspect of the present invention include an etching process that selectively etches through only one side of a substrate to an infrared absorber and common electrode assembly. The present invention provides highly selective etching processes which differentiate between the various materials typically used to form a focal plane array associated with a thermal detector. For example, the teachings of the present invention allow selectively etching different materials such as masked and unmasked regions of a substrate of pyroelectric material and portions of an infrared absorber and common electrode assembly disposed on the substrate opposite from the masked and unmasked regions to produce an array of thermal sensors that have a desired geometrical configuration and electrical signal characteristics.

One aspect of the present invention includes a method for forming an array of thermal sensors from a pyroelectric substrate having an infrared absorber and common electrode assembly attached thereto. A first layer of metal contacts may be formed to define masked and unmasked regions of the substrate. A second layer of metal contacts may be formed on the first layer of contacts. A mask layer may be formed to encapsulate the exposed portions of the second layer of contacts. The unmasked regions are exposed to an etchant and irradiated to substantially increase the reactivity between the unmasked regions and the etchant such that during irradiation, the etchant etches the unmasked regions substantially faster than the first layer of contacts and the mask layer.

An advantage provided by one aspect of the present invention is a method for directionally etching a substrate from one side to the other side to form an array of thermally isolated temperature sensitive elements that are attached to an infrared absorber and common electrode assembly.

Additional technical advantages of the present invention include providing a highly directional, anisotropic etching process which induces very little material damage or change in surface composition of selected materials. Combining ultraviolet electromagnetic irradiation with etching techniques in accordance with the teachings of the present invention allows relatively low cost equipment to produce a relatively fast etch rate as compared to previous techniques. The present invention allows batch processing of substrates at relatively low temperatures and avoids the costs of high temperature, expensive annealing techniques. Also, the present invention allows using of relatively thin etch stops to prevent undesired removal of material while at the same time allowing for reticulation of very complex geometric patterns.

Another aspect of the present invention is a method for forming an array of thermal sensors from a pyroelectric substrate having an infrared absorber and common electrode assembly attached thereto. A first layer of contacts may be formed to define masked and unmasked regions of the substrate. A second layer of contacts may be formed on the first layer of contacts. A radiation etch mask layer is formed to encapsulate the exposed portions of the second layer of contacts. A dry-etch mask layer is formed to encapsulate the exposed portions of the first layer of contacts and the radiation etch mask layer. An initial portion of each unmasked region may be etched using a dry-etch process. The remaining portions of the unmasked regions are exposed to an etchant and irradiated with electromagnetic energy to substantially increase the reactivity between the remaining portions and the etchant. During such irradiation, the etchant etches the remaining portions substantially faster than the first layer of contacts and the radiation etch mask layer.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiments of the present invention and its advantages are best understood by referring to FIGS. 1–5 of the drawings, like numerals being used for like and corresponding parts of the various drawings.

Figure 1:
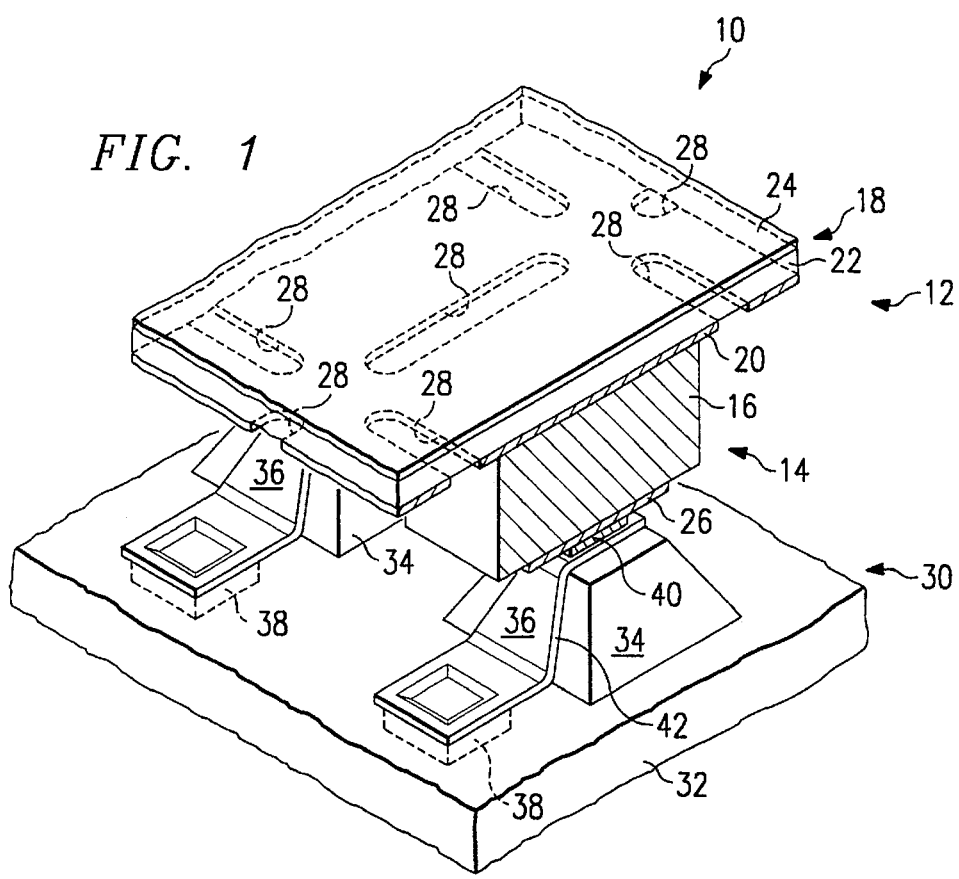
FIG. 1 is a perspective view showing a portion of a thermal imaging system that can be formed according to teachings of the present invention.

FIG. 1 shows a portion of thermal imaging system 10 having focal plane array 12 comprising an array of thermal sensors 14 that can be formed according to the teachings of the present invention. Sensors 14 each include a thermal sensitive element 16, which in one aspect of the present invention may be formed from a pyroelectric substrate comprising barium strontium titanate (BST). Thermal sensitive element 16 may be formed from various types of pyroelectric and/or bolometric material in accordance with the teachings of the present invention.

In one embodiment, infrared absorber and common electrode assembly 18 is preferably attached to one side of each thermal sensitive element 16. Infrared absorber and common electrode assembly 18 is typically a multiple layered structure that forms a resonant cavity tuned to maximize absorption of the selected infrared spectrum depending in part upon the type of material used to form thermal sensitive element 16. Infrared absorber and common electrode assembly 18 includes common electrode 20 which is preferably attached to one side of each thermal sensitive element 16.

One or more layers of thermal sensitive optical coating 22 may be disposed on common electrode 20 opposite from thermal sensitive elements 16. Optical coating 22 may be formed from an organic material such as parylene. The thickness of optical coating 22 may be adjusted as appropriate for its refractive index to maximize absorption over the desired infrared spectrum. A thin outer layer 24 of semitransparent metal or other suitable material may be disposed on optical coating 22 opposite from common electrode 20. Nichrome (NiCr) is one example of the material which may be used to form common electrode 20. Other examples include titanium tungsten (TiW) and cermet. Common electrode 20 is typically relatively thin as compared to optical coating 22.

Sensor signal electrodes 26 are preferably attached to the respective opposite side of each thermal sensitive element 16. Slots 28 may be formed, i.e., reticulated, into common electrode 20 to provide enhanced thermal isolation between adjacent thermal sensors 14. Alternatively, slots 28 may extend partially or fully through optical coating 22 and outer layer 24.

Thermal isolation structures 30 are typically provided to support thermal sensors 14 on integrated-circuit substrate 32. Each isolation structure 30 includes a mesa-type structure 34, a mesa strip conductor 36, and a contact pad 38. A layer 40 of metallic bump-bonding material may be used to electrically couple each mesa-strip conductor 36 to a respective sensor signal electrode 26.

In operation, thermal imaging system 10 forms a pixel image of a scene from absorbed infrared radiation. Each thermal sensor 14 provides at contact pad 38 an electrical signal whose value is proportional to the amount of infrared radiation absorbed by the respective thermal sensor 14. Thus, each thermal sensor 14 provides data for one pixel of the resulting image.

Typically, a section of infrared absorber and common electrode assembly 18, corresponding to each thermal sensor 14, will absorb infrared radiation which changes the temperature of the respective thermal sensitive element 16. For pyroelectric materials this temperature change will vary the electrical polarization and capacitance of the respective thermal sensitive element 16. An electrical current or voltage may flow between common electrode 20 and contact pad 38 via the respective thermal sensitive element 16, electrode 26, layer 40, and strip conductor 36. Thus, the changes in the electrical characteristics of thermal sensitive element 16 varies this current or voltage in proportion to the amount of infrared radiation absorbed by the respective thermal sensor 14.

Thermal imaging system 10 is further described in U.S. patent application Ser. No. 08/235,835, entitled *Inter-Pixel Thermal Isolation For Hybrid Thermal Detectors*, Attorney's Docket TI-18636, filed Apr. 29, 1994, and assigned to Texas Instruments Incorporated, Dallas, Tex. For some applications common electrode 20 may be replaced with a layer of nonconductive material (not shown) and a second electrode (not shown) similar to electrode 26 may be formed on each thermal sensitive element 16.

One aspect of the present invention includes a method for forming thermal sensitive elements 16 and related components of thermal sensors 14 by etching substrate 46 and multiple layers of material disposed thereon (FIGS. 2A–4B) from one side only. As previously noted substrate 46 may be formed from various types of pyroelectric and/or bolometric material.

Substrate 46 preferably has dimensions associated with four, six or eight inch disks or wafers compatible with fabrication techniques for very large scale integrated circuits. Infrared absorber and common electrode assembly 18 is preferably attached to one side of substrate 46. As shown in FIGS. 2A through 4B, various types of mask structures 44 may be formed on the other side of substrate 46 opposite from common electrode 20. Mask structures 44 and 74 are used to provide masked regions 61 and unmasked regions 68 on substrate 46.

Figure 2A:
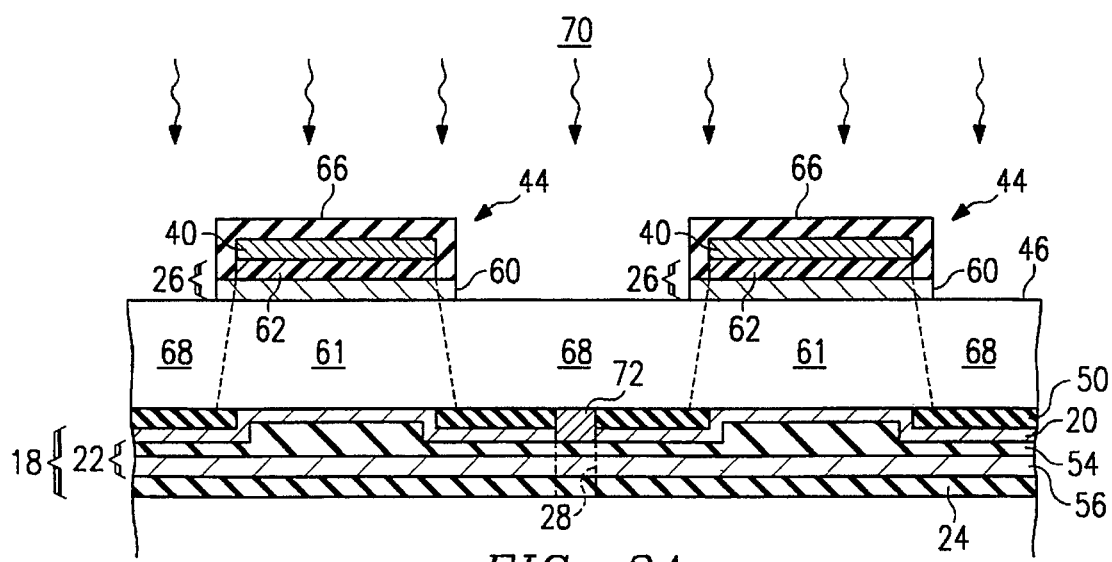
FIG. 2A is a drawing in section with portions broken away of an electromagnetic radiation etch mask structure formed on one side of a substrate having portions of an infrared absorber and common electrode assembly attached to its other side.

FIG. 2A illustrates a radiation etch mask structure 44, which can be used in conjunction with a radiation etching process to form an array of temperature sensitive elements 16 (FIG. 1) from substrate 46 having infrared absorber and common electrode assembly 18 formed on the one side thereof. Etch stops 50 may be formed to protect or allow reticulation of selected portions of infrared absorber and common electrode assembly 18. As described above, infrared absorber and common electrode assembly 18 comprises a common electrode 20, an optical coating 22, and an outer layer 24. Typically, optical coating 22 comprises an absorbing layer 54 and a semitransparent layer 56. The thickness of absorbing layer 54 is preferably an odd number of quarter wavelengths of the infrared wavelength that infrared absorber and common electrode assembly 18 is designed to absorb. Layer 56 is preferably semitransparent to this chosen infrared wavelength.

In one aspect of the present invention, electrode 20 and layer 56 comprise titanium tungsten (Ti/W), layer 54 comprises polyamide or parylene, and optional outer layer 24 comprises parylene. Alternative structures and formations for infrared absorber and common electrode assembly 18 are further described in U.S. patent application Ser. No. 08/222, 146, entitled *Multiple Level Mask for Patterning of Ceramic Materials*, Attorney's Docket TI-19182 filed Apr. 4, 1994, and assigned to Texas Instruments Incorporated, Dallas, Tex.

Mask structure 44 may be formed on one side of substrate 46 using vapor deposition or similar semiconductor fabrication techniques. A first layer of electrically conductive contacts 60 may be formed on the other side of substrate 46 to partially define masked regions 61 and unmasked regions 68 of substrate 46. Masked regions 61 are the regions of substrate 46 that remain unetched during the etching process, and thus become thermal sensitive elements 16 after the completion of the various fabrication processes. The dashed lines separating regions 61 and 68 are angled to indicate that the selected etchant may undercut mask structure 44 during the etching process. For this reason, portions of unmasked regions 68 lie beneath the associated mask structure 44.

A second layer of electrically conductive contacts 62 may be formed over first layer of contacts 60. Together, contacts 60 and 62 form electrodes 26. Layer 40 of bump bonding material may be formed on second layer of contacts 62. Alternatively, layer 40 may be formed after completion of etching substrate 46. A mask layer 66 may then be formed to encapsulate the exposed portions of contacts 62, and if layer 40 is present, the exposed portions thereof. Such encapsulation forms a fluid barrier between an etchant 70 and contacts 62 and layer 40. However, as shown, the side portions of first layer of contacts 60 may remain exposed. Thus, contacts 60 typically comprise a material that is substantially nonreactive with etchant 70. In one aspect of the invention, contacts 60 may comprise titanium tungsten (TiW) or platinum (Pt), contacts 62 may comprise layers of nichrome and gold, bonding layer 40 may comprise bump bonding material such as indium (In), and mask layer 66 may comprise spun-on silicon dioxide ($SiO_2$).

Contacts 60 and/or 62 may be formed from other types of material such as nickel, platinum, tantalum, palladium, ruthenium, ruthenium oxide and other materials having the desired characteristics for the specific application. Mask layer 66 may also be formed from various non-metal elements and compounds which absorb electromagnetic radiation during etching of unmasked regions 68, but are either not etched or etched at a slower rate by the selected etchant 70. Examples of such alternative materials will be discussed later in more detail.

Still referring to FIG. 2A, a process controller (not shown) may be used to expose mask structure 44 and unmasked regions 68 to etchant 70 and to activate a radiation source (not shown) that irradiates regions 68 with electromagnetic radiation, typically ultraviolet radiation (UVR) having a wavelength less than 400 nanometers in a direction substantially normal to the surface of substrate 46. The UVR substantially increases the reactivity between etchant 70 and the irradiated portions of unmasked regions 68 in contact therewith. In contrast, the UVR has relatively little effect on the reactivities between etchant 70 and mask layers 66 and the exposed portions of contacts 60. Furthermore, because contacts 60 and 62 cooperate with each other to shield masked regions 61 and the UVR is substantially normal to the surface of substrate 46, the UVR has essentially no effect on the reactivity between etchant 70 and the exposed sidewalls of masked regions 61. Thus, during the irradiation step, etchant 70 may etch unmasked regions 68 as much as ten (10) times faster than it etches mask layer 66 and the exposed portions of contacts 60.

In one aspect of the present invention, etchant 70 may include a chloride solution comprising ten percent (10%) HCl plus water. However, etchant 70 may be any fluid or other substance that is compatible with the described UVR etching process. For some applications etchant 70 may be a chloride salt solution such as NH4CL or NaCl. For other applications various acid and salt solutions such as HF, HBr, HI, $NH_4F$, $NH_4Br$, $NH_4I$, $CaF_2$, KBr, NaI and other simple salt or acid solutions may be satisfactorily used as etchant 70.

The process controller will preferably continue the irradiation until etchant 70 etches through unmasked regions 68 to etch stop 50. During the irradiation stop, etchant 70 is preferably selected to etch unmasked regions 68 at least ten (10) times faster than it will etch stop 50. If common electrode 20 is formed from a material that is substantially nonreactive with etchant 70, and no reticulation of infrared absorber and common electrode assembly 18 is desired, etch stop 50 may be omitted.

In order to reduce thermal transfer between thermal sensors 14 beyond the reduction provided by thermal isolation structure 30, the process controller may commence a reticulation process to partially or fully reticulate infrared absorber and common electrode assembly 18 to form slots 28 (FIG. 1). Etch stops 50 define openings 72 that expose the portions of coating 18 that are to be reticulated. Next, depending upon the desired degree of thermal isolation, the process controller may commence a reticulation process to etch partially or fully through these exposed portions of infrared absorber and common electrode assembly 18. In one aspect of the present invention as shown in FIG. 1, the reticulation process only reticulates through common electrode 20 to form slots 28. The reticulation process may entail the use of etchant 70 or other selected etchants that are reactive with the various layers of infrared absorber and common electrode assembly 18 that are desired to be reticulated. After the etching and reticulation processes are complete, mask layers 66 may be removed by conventional techniques.

Mask layers 66 and other mask structures incorporating the present invention may be formed from spun-on silicon dioxide. Also, various other non-metal elements and compounds which absorb electromagnetic radiation during etching of unmasked regions 68 but are not etched by the selected etchant 70 may also be satisfactorily used with the present invention. Examples of other alternative materials for forming mask layers in accordance with the present invention include spun-on silicon oxide doped with transition metals such as iron (Fe), palladium (Pd) or manganese (Mn) which will absorb electromagnetic radiation and still not react with the selected etchant 70. Poly-Si is an example of another material which absorbs electromagnetic radiation and only etches slowly when exposed to selected etchant 70. Further alternative materials include silicon nitride ($Si_3N_4$), aluminum oxide ($Al_2O_3$), boric acid ($B_2O_3$) and tantalum oxide ($Ta_2O_5$). The above materials may be selectively deposited as desired using standard semiconductor fabrication techniques such as spun-on and fired, chemical vapor deposition, plasma enhanced chemical vapor deposition, sputter deposition, reactive sputter deposition as well as electron beam and thermal evaporation with or without reactive deposition.

Figure 2B:
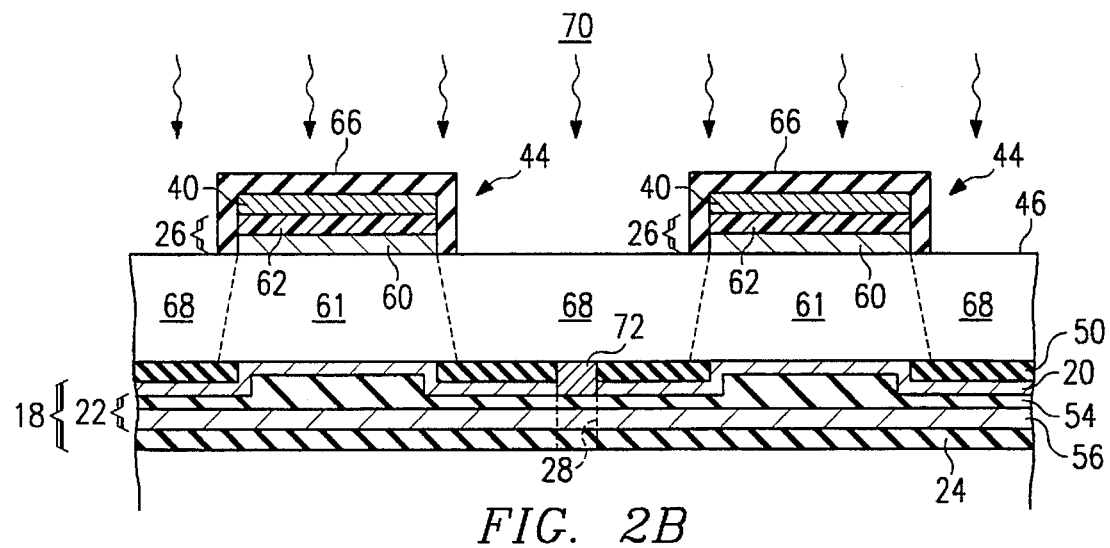
FIG. 2B shows an alternate embodiment of the electromagnetic radiation etch mask structure of FIG. 2A.

FIG. 2B illustrates an alternative embodiment of radiation etch mask structure 44 in which mask layers 66 encapsulates the exposed portions of first layer of contacts 60 in addition to encapsulating the exposed portions of second layer of contacts 62 and, if present, of bonding layers 40. This encapsulation forms a fluid barrier between contacts 60 and etchant 70 and thus allows contacts 60 to comprise a material that may be substantially reactive with etchant 70. The etching and reticulation processes used with alternate mask structure 44 are otherwise similar to those discussed above in conjunction with the embodiment of FIG. 2A.

Figure 3A:
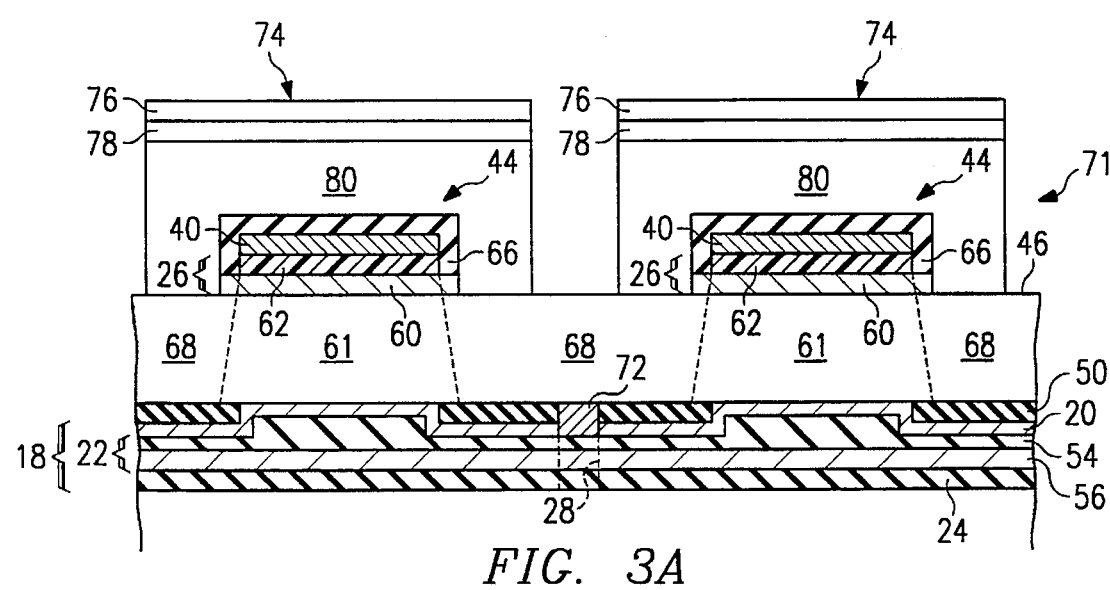
FIG. 3A is a drawing in section with portions broken away of a combination dry-etch/radiation etch mask structure formed on one side of a substrate having portions of an infrared absorber and common electrode assembly attached to its other side.

FIG. 3A shows a combination mask structure 71, which comprises a dry etch mask structure 74 and radiation etch mask structure 44 of FIG. 2A. Combination mask structure 71 allows the process controller to use a combination dry etch/radiation etch process to etch unmasked regions 68. Typically, ion-milling may be used to etch an initial portion of each unmasked region 68, and a radiation etch process, such as the above-described UVR etch process, to etch the remaining portion of each unmasked region 68. Thus, the process can realize the advantages of a dry etch process for most of the etching process without causing damage to infrared absorber and common electrode assembly 18.

First, the dry etch process etches a predetermined distance from one side of unmasked regions 68 toward the other side adjacent to infrared absorber and common electrode assembly 18. This predetermined distance leaves remaining portions of unmasked regions 68 having a thickness that is sufficient to prevent the dry etch process from damaging infrared absorber and common electrode assembly 18. The value of the predetermined distance varies according to the dry etch process and the type of material used to form substrate 46.

Figure 3B:
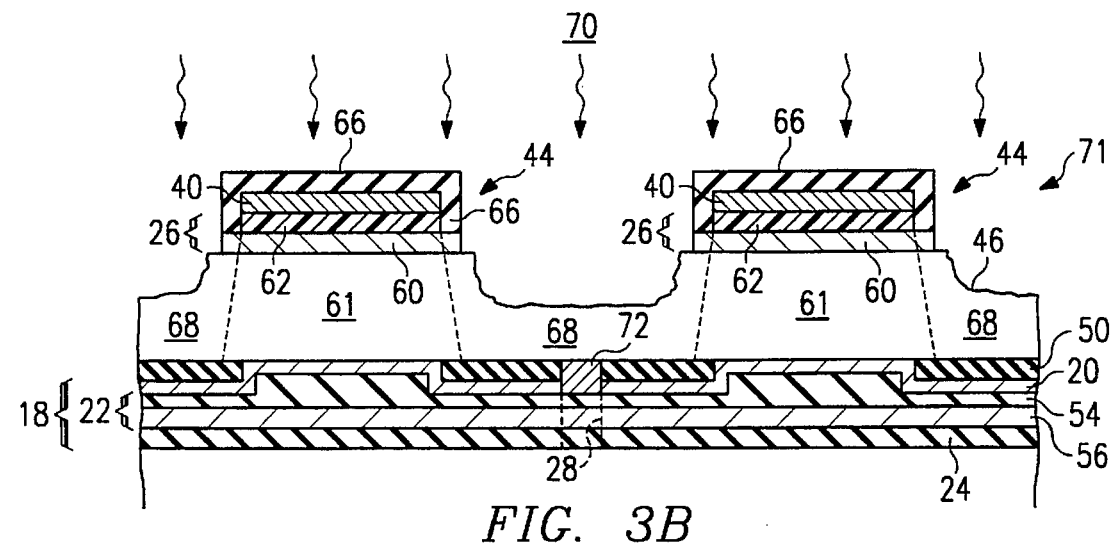
FIG. 3B shows the substrate and mask structure of FIG. 3A after exposure to a selected dry etching process.

FIG. 3B shows the semiconductor structure of FIG. 3A after the completion of the dry etching process and during the initial stages of the radiation etching process. The dry etching process destroys most or all of dry etch mask 74, which is formed thick enough to insure that the dry etching process does not damage radiation etch mask structure 44. After the dry etching process is complete, the process controller preferably etches the remaining portions of unmasked regions 68 using a radiation etching process such as the UVR etching process described above in conjunction with the embodiment of FIG. 2A. The process controller may also partially or fully etch the portions of infrared absorber and common electrode assembly 18 exposed by etch-stop openings 72 to reticulate slots 28 as described above in conjunction with the embodiment shown in FIG. 2A.

Figure 4A:
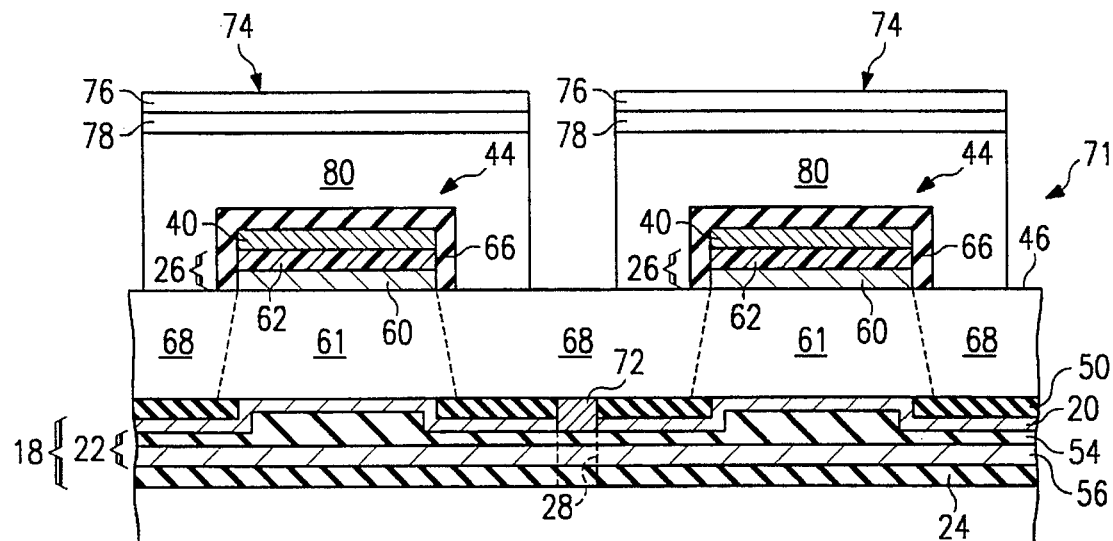
FIG. 4A shows an alternate embodiment of the dry-etch/radiation etch mask structure of FIG. 3A.

FIG. 4A shows an alternate embodiment of combination mask structure 71, which is similar to that of FIG. 3A except that mask layer 66 encapsulates the exposed portions of first layer of contacts 60 as described above in conjunction with FIG. 2B. The dry etching process used with alternate mask structure 71 is otherwise similar to those discussed above in conjunction with the embodiment shown in FIG. 3A.

Figure 4B:
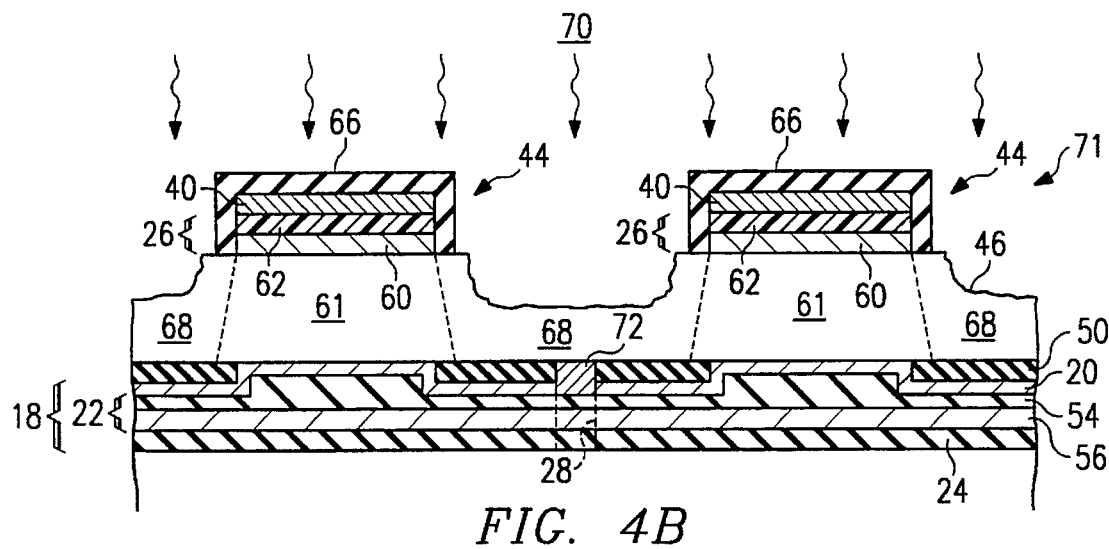
FIG. 4B shows the substrate and mask structure of FIG. 4A after exposure to a selected dry etching process.

FIG. 4B shows combination mask structure 71 of FIG. 4A after completion of the dry etching process and during the initial stages of the radiation etching process. The remaining portions of unmasked regions 68 are radiation etched and slots 28 may be reticulated as discussed above in conjunction with the embodiment shown in FIG. 3B.

Figure 5:
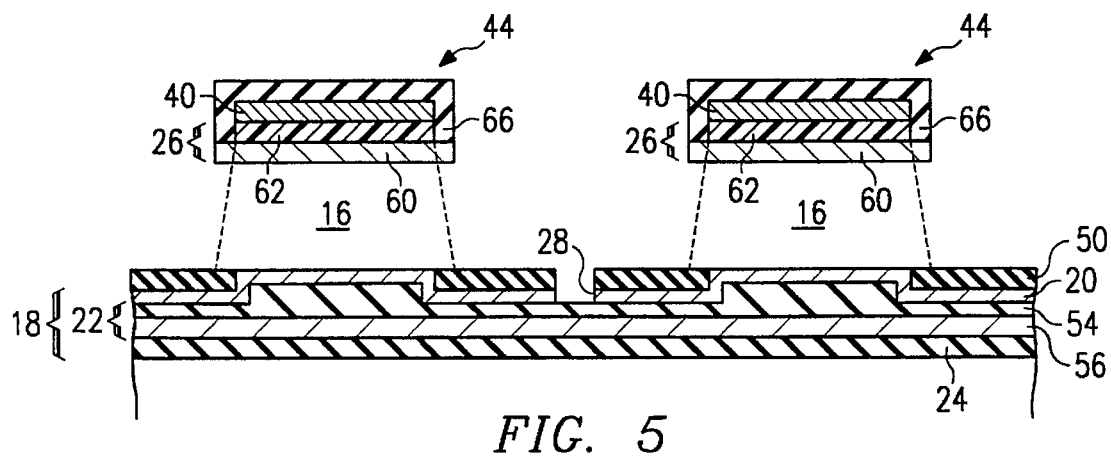
FIG. 5 shows the substrate and mask structures of FIGS. 2A–B, 3B, and 4B after exposure to an electromagnetic radiation etching process.

FIG. 5 shows the resulting semiconductor structure of FIGS. 2A–B, 3B, and 4B after the completion of the radiation etching process but before radiation etch mask layers 66 have been removed. Unmasked regions 68 have been substantially removed leaving thermal sensitive elements 16, and slots 28 are reticulated through common electrode 20. However, as discussed above, slots 28 may be omitted or may be reticulated partially or fully through layers 54, 56, and outer layer 24 as well as through common electrode 20. After the removal of mask layers 66, bonding layers 40 can be attached to mesa-strip conductors 36 of thermal isolation structures 30 to form thermal imaging system 10.

Referring again to FIGS. 3A and 4A, in one aspect of the invention, dry etch mask 74 is a tri-level mask comprising three layers 76, 78, and 80. Photosensitive, i.e., outer, mask layer 76 comprises a photoresist and has a thickness of approximately 1.5 micrometers (μm). Dry etch-selective, i.e., intermediate, mask layer 78 may comprise TiW and has a thickness of approximately 1,000 angstroms (Å). Ion-milling, i.e., inner, mask layer, 80 may comprise a photoresist and has a thickness of approximately 15 μm. Outer layer 76 may be patterned by standard photolithographic means and used as an etch mask for underlying intermediate layer 78. After intermediate layer 78 is patterned by plasma etch means using the gas $CF_4$ or an equivalent, intermediate layer 78 is used as a mask for underlying inner layer 80. Outer layer 76 may be partially or fully etched away at the same time that inner layer 80 is etched. Vertical sidewalls of inner mask layer 80 are preferably achieved with a low pressure (<10 mTorr) dry etch.

The resulting vertical sidewall tri-level mask 74 is now used as an ion-mill mask during ion milling of the initial portion of each unmasked region 68. Typically, any portion of layers 76 and 78 remaining after the etching of layer 80 will be etched away during the ion milling of unmasked regions 68. Furthermore, depending upon the predetermined distance, i.e., the depth occupied by the initial portions of unmasked regions 68, the ion-milling process may etch away a substantial portion of inner layer 80. Thus, dry etch mask 74, and particularly inner layer 80, are made thick enough so that radiation etch mask structure 44 is not damaged during the ion-milling process. Dry etch mask 74 and the formation thereof are described in U.S. patent application Ser. No. 08/222,146 (Attorney's Docket No. TI-19182), entitled *Multiple Level Mask for Patterning of Ceramic Materials*, filed Apr. 4, 1994, and assigned to Texas Instruments Incorporated, Dallas, Tex.

Although the present invention and its advantages have been described in detail, it should be understood that various changes, substitutions and alterations can be made therein without departing from the spirit and scope of the invention as defined by the appended claims.

What is claimed is:

1. A method for forming an array of thermal sensitive elements from a substrate having portions of an infrared absorber and common electrode assembly attached thereto, comprising the steps of:

forming a first layer of electrically conductive contacts on one side of said substrate to at least partially define masked and unmasked regions thereof;

forming a second layer of electrically conductive contacts on said first layer of contacts;

encapsulating the exposed portions of said second layer of contacts with a radiation etch mask layer;

encapsulating the exposed portions of said first layer of contacts and said radiation etch mask layer with a dry-etch mask layer;

dry etching through an initial portion of each of said unmasked regions;

exposing a remaining portion of each of said unmasked regions to an etchant;

irradiating said remaining portions of said unmasked region with electromagnetic energy to substantially increase the reactivity between said remaining portions and said etchant; and wherein during said step of irradiating, said etchant etches said remaining portions substantially faster than said first layer of contacts and said radiation etch mask layer.

2. The method of claim 1 further comprising the steps of:

forming a bump bonding layer on said second layer of contacts; and encapsulating the exposed portions of said bump bonding layer with said radiation etch mask layer.

3. The method of claim 1 wherein said etchant comprises a chloride solution.

4. The method of claim 1 wherein said step of irradiating comprises irradiating said unmasked regions with ultraviolet light.

5. The method of claim 1 wherein during said step of irradiating, said etchant etches said remaining portions of said unmasked regions through to, and substantially faster than, said infrared absorber and common electrode assembly.

6. The method of claim 1 wherein an etch stop is disposed between said substrate and said infrared absorber and common electrode assembly, in alignment with said unmasked regions; and wherein during said step of irradiating, said etchant etches said remaining portions of said unmasked regions through to, and substantially faster than, said etch stop.

7. The method of claim 6 wherein said etch stop defines openings that expose portions of said infrared absorber and common electrode assembly, the method further comprising etching said exposed portions of said infrared absorber and common electrode assembly to form slots therein.

8. The method of claim 1 wherein said etchant comprises ten percent HCl in a water solution.

9. The method of claim 1 wherein said first layer and said second layer of electrically conductive contacts comprise material selected from the group consisting of nickel, nichrome, platinum, titanium tungsten, tantalum, palladium, ruthenium and ruthenium oxide.

10. The method of claim 1 wherein said electromagnetic energy has a wavelength less than 400 nanometers.

11. The method of claim 1 wherein said etchant is selected from the group consisting of $NH_4CL$, $NaCl$, $FH$, $HBr$, $HI$, $NH_4Br$, $NH_4I$, $CaF_2$, $KBr$ and $NaI$.

12. The method of claim 1 wherein said step of encapsulating with a dry-etch mask layer comprises:

encapsulating said radiation etch mask layer with an ion-mill mask layer;

forming a dry-etch-selective mask layer on said ion-mill mask layer, said dry-etch-selective mask layer comprising a different material than said ion-mill mask layer;

forming a photosensitive layer on said dry-etch-selective mask layer, said photosensitive layer comprising a different material than said dry-etch-selective mask layer;

forming a predetermined pattern in said photosensitive layer using photolithography;

forming said predetermined pattern in said dry-etch-selective mask layer using said photosensitive layer as a first etch mask;

forming said predetermined pattern in said ion-mill mask layer using said dry-etch-selective mask layer as a second etch mask, said ion-mill mask layer having substantially vertical walls; and wherein said step of dry etching comprises ion-milling said unmasked regions using said ion-mill mask layer as a third etch mask such that said substantially vertical walls of said ion-mill mask layer allow substantially vertical walls to be formed around said unmasked regions.

13. A method for forming an array of thermal sensitive elements from a pyroelectric substrate having an infrared absorber and common electrode assembly attached thereto, comprising:

forming a first layer of contacts on said substrate to define masked and unmasked regions thereof;

forming a second layer of contacts on said first layer of contacts;

encapsulating the exposed portions of said first layer of contacts and said second layer of contacts with a radiation etch mask layer;

encapsulating the exposed portions of said radiation etch mask layer with a dry-etch mask layer;

dry etching through an initial portion of each of said unmasked regions;

exposing a remaining portion of each of said unmasked regions to an etchant;

irradiating said substrate with electromagnetic energy to substantially increase the reactivity between said remaining portions of said unmasked regions and said etchant; and wherein during said step of irradiating, said etchant etches said remaining portions substantially faster than said radiation etch mask layer.

14. The method of claim 13 further comprising the steps of:

forming a bump bonding layer on said second layer of contacts; and encapsulating the exposed portions of said bump bonding layer with said radiation etch mask layer.

15. The method of claim 13 wherein said etchant comprises a chloride solution.

16. The method of claim 13 wherein said step of irradiating comprises irradiating said remaining portions of said unmasked regions with ultraviolet light.

17. The method of claim 13 further comprising the steps of:

forming an etch stop disposed between said infrared absorber and common electrode assembly and said substrate in general alignment with said unmasked regions; and wherein during said step of irradiating, said etchant etches said remaining portions of said unmasked regions through to, and substantially faster than, said etch stop.

18. The method of claim 13 wherein said infrared absorber and common electrode assembly comprises a common electrode adjacent to said substrate and said etch stop defines openings that expose portions of said electrode, the method further comprising the step of etching through said exposed portions of said electrode to form slots therein.

19. The method of claim 13 wherein said substrate is formed from barium strontium titanate.

20. The method of claim 13 wherein said step of encapsulating with a dry-etch mask layer comprises the steps of:

encapsulating said radiation etch mask layer with an ion-mill mask layer;

forming a dry-etch-selective mask layer on said ion-mill mask layer, said dry-etch-selective mask layer comprising a different material than said ion-mill mask layer;

forming a photosensitive layer on said dry-etch-selective mask layer, said photosensitive layer comprising a different material than said dry-etch-selective mask layer;

forming a predetermined pattern in said photosensitive layer using photolithography;

forming said predetermined pattern in said dry-etch-selective mask layer using said photosensitive layer as a first etch mask;

forming said predetermined pattern in said ion-mill mask layer using said dry-etch-selective mask layer as a second etch mask, said ion-mill mask layer having substantially vertical walls; and wherein said step of dry etching comprises ion-milling said initial portions of said unmasked regions using said ion-mill mask layer as a third etch mask such that said substantially vertical walls of said ion-mill mask layer allow substantially vertical walls to be formed around said unmasked regions.

* * * * *